United States Patent
Lin et al.

(10) Patent No.: US 11,614,481 B2
(45) Date of Patent: Mar. 28, 2023

(54) THROUGH-SILICON VIA DETECTING CIRCUIT, DETECTING METHODS AND INTEGRATED CIRCUIT THEREOF

(71) Applicant: Changxin Memory Technologies, Inc., Anhui (CN)

(72) Inventors: You-Hsien Lin, Hefei (CN); Yi-Jun Lu, Hefei (CN); Cheng-Jer Yang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 46 days.

(21) Appl. No.: 17/238,476

(22) Filed: Apr. 23, 2021

(65) Prior Publication Data
US 2021/0239751 A1 Aug. 5, 2021

Related U.S. Application Data

(63) Continuation of application No. PCT/CN2019/115051, filed on Nov. 1, 2019.

(30) Foreign Application Priority Data

Nov. 9, 2018 (CN) .......................... 201811333520.9
Nov. 9, 2018 (CN) .......................... 201821846291.6

(51) Int. Cl.
*G01R 31/28* (2006.01)

(52) U.S. Cl.
CPC ..... *G01R 31/2853* (2013.01); *G01R 31/2882* (2013.01)

(58) Field of Classification Search
CPC ............ G01R 31/2853; G01R 31/2882; G01R 31/2843; G01R 31/28
See application file for complete search history.

(56) References Cited

U.S. PATENT DOCUMENTS

| | | | |
|---|---|---|---|
| 9,455,190 B2* | 9/2016 | Cho | ................ H01L 21/76898 |
| 2011/0102006 A1* | 5/2011 | Choi | .............. G01R 31/318513 |
| | | | 324/762.01 |

(Continued)

FOREIGN PATENT DOCUMENTS

| CN | 102655101 A | 9/2012 |
|---|---|---|
| CN | 209542774 U | 10/2019 |

OTHER PUBLICATIONS

PCT International Search Report and the Written Opinion dated Jan. 9, 2020, issued in related International Application No. PCT/CN2019/115051 (9 pages).

*Primary Examiner* — Akm Zakaria
(74) *Attorney, Agent, or Firm* — Sheppard Mullin Richter & Hampton LLP

(57) ABSTRACT

A TSV detecting circuit, TSV detecting methods, and an integrated circuit thereof are disclosed by the present disclosure. The TSV detecting circuit includes a first detecting module includes: a first comparison unit; a first input unit, for transmitting an input signal to a first input of the first comparison unit controlled by a first clock signal; a first switching unit for transmitting a signal of a first node to a second input of the first comparison unit controlled by a first detection control signal, the first node coupled to a first terminal of the TSV; and a second detecting module includes: a second input unit for transmitting the input signal to a second node controlled by a second clock signal; a second switching unit for transmitting a signal of the second node to a second terminal of the TSV controlled a second detection control signal.

20 Claims, 7 Drawing Sheets

(56) References Cited

U.S. PATENT DOCUMENTS

| | | |
|---|---|---|
| 2013/0093454 A1 | 4/2013 | Lai et al. |
| 2013/0230932 A1 | 9/2013 | Bringivijayaraghavan et al. |
| 2013/0293255 A1* | 11/2013 | Wu .................... G01R 31/2601 |
| | | 324/762.01 |
| 2014/0043057 A1 | 2/2014 | Kim et al. |
| 2014/0266291 A1* | 9/2014 | Fkih .................... G01R 31/2601 |
| | | 324/762.01 |
| 2016/0027706 A1 | 1/2016 | Bringivijayaraghavan et al. |

\* cited by examiner

THROUGH-SILICON VIA DETECTING CIRCUIT, DETECTING METHODS AND INTEGRATED CIRCUIT THEREOF

CROSS-REFERENCE TO RELATED APPLICATIONS

This application is a continuation application of International Patent Application No. PCT/CN2019/115051, filed on Nov. 1, 2019, which is based on and claims priority to and benefits of the Chinese Patent Applications No. 201811333520.9 and 201821846291.6, both filed with the China National Intellectual Property Administration (CNIPA) of the People's Republic of China on Nov. 9, 2018. The entire content of the above-referenced applications is incorporated herein by reference.

TECHNICAL FIELD

The present disclosure relates to the field of integrated circuit (IC) chip technology, and in particular, to a through-silicon via (TSV) detecting circuit, TSV detecting methods, and an integrated circuit having the same.

BACKGROUND

With the development and advancement of technologies, three dimensional (3D) chips are more and more popular. The 3D chips use TSVs to connect a plurality of layers of chips. The TSVs may be susceptible to failures during manufacturing and bonding, and the TSV failures will affect the performance of the 3D chips.

At present, a failure detection is usually performed first, and redundant TSVs are used to shield the failed TSVs by programming the control signals of the multiplexers. However, due to a high cost of the redundant TSVs and the corresponding detection circuit, it is not suitable to be used in mass production of 3D chips.

It is to be noted that the above information disclosed in this Background section is only for enhancement of understanding of the background of the invention and therefore may contain information that does not form the prior art already known to a person of ordinary skill in the art.

SUMMARY OF THE INVENTION

The embodiments of the present disclosure present a through-silicon via detecting circuit, TSV detecting methods, and an integrated circuit having the same, which overcome the problems arising from limitations and defects of the related art, including a high cost of the redundant TSVs and the corresponding detection circuit as well as not being suitable to be used in a mass production of 3D chips.

One aspect of the present disclosure is directed to a through-silicon via (TSV) detecting circuit, comprising: a first detecting module including a first comparison unit; a first input unit, configured to transmit an input signal to a first input of the first comparison unit under a control of a first clock signal; a first switching unit, configured to transmit a signal of a first node to a second input of the first comparison unit under a control of a first detection control signal, the first node being coupled to a first terminal of the TSV; and a second detection module including: a second input unit, configured to transmit the input signal to a second node under a control of a second clock signal; a second switching unit, configured to transmit a signal of the second node to a second terminal of the TSV under a control of a second detection control signal.

According to one exemplary embodiment of the present disclosure, the first input unit may comprise: a first flip-flop, comprising an input coupled to the input signal, an output coupled to the first input of the first comparison unit, and a clock terminal coupled to the first clock signal.

According to one exemplary embodiment of the present disclosure, the first input unit may further comprise: a first selector, comprising a first input coupled to the input signal, a second input coupled to an output of the first comparison unit, a control terminal coupled to a first selection control signal, and an output coupled to the input of the first flip-flop.

According to one exemplary embodiment of the present disclosure, the first detecting module may further comprise: a third switching unit, comprising a first terminal coupled to the output of the first flip-flop, a second terminal coupled to the first node, and a control terminal coupled to the first detection control signal.

According to one exemplary embodiment of the present disclosure, the second input unit may comprise: a second flip-flop, comprising an input coupled to the input signal, an output coupled to a second node, and a clock terminal coupled to the second clock signal.

According to one exemplary embodiment of the present disclosure, the second input unit may further comprise: a second selector, comprising a first input coupled to the input signal, a control terminal coupled to a second selection control signal, and an output coupled to the input of the second flip-flop.

According to one exemplary embodiment of the present disclosure, the second detecting module may further comprise: a fourth switching unit, comprising a first terminal coupled to the second terminal of the TSV and a control terminal coupled to the second detection control signal; and a second comparison unit, comprising a first input coupled to a second terminal of the fourth switching unit, a second input coupled to the second node and an output coupled to a second input of the second selector.

According to one exemplary embodiment of the present disclosure, the first detecting module may be disposed on a first chip layer; the second detecting module may be disposed on a second chip layer; and the first chip layer and the second chip layer may be connected by at least one TSV.

According to one exemplary embodiment of the present disclosure, the at least one TSV may include a plurality of sequentially connected TSVs.

According to one exemplary embodiment of the present disclosure, a plurality of first detecting modules may be sequentially disposed on the first chip layer, and wherein the output of the first flip-flop of each first detecting module may be connected to the input of an immediately succeeding first detection module; and a plurality of second detecting modules may be sequentially disposed on the second chip layer, and wherein the output of the second flip-flop of each second detecting module may be connected to the input of an immediately succeeding second detection module.

According to one exemplary embodiment of the present disclosure, the TSV detecting circuit may further comprise: a third comparison unit, wherein the outputs of a plurality of first comparison units of the plurality of first detecting modules are respectively connected to inputs of the third comparison unit.

According to one exemplary embodiment of the present disclosure, each of the comparison units may include at least an XOR gate.

According to one exemplary embodiment of the present disclosure, the first switching unit may be an N-type MOS transistor and the second switching unit may be a P-type MOS transistor; or the first switching unit may be a P-type MOS transistor and the second switching unit may be an N-type MOS transistor.

According to one exemplary embodiment of the present disclosure, each of the first switching unit and the second switching unit may be a complementary metal oxide semiconductor (CMOS) transmission gate.

According to one exemplary embodiment of the present disclosure, the TSV detecting circuit may be configured to: detect a defected TSV in a plurality of chip layers; determine a location of the defected TSV; and shield the defected TSV with a redundant TSV disposed in the plurality of chip layers.

According to one exemplary embodiment of the present disclosure, the TSV detecting circuit may be further configured to detect and shield the defected TSV located anywhere in the IC, such as between a topmost chip layer and a layer immediately beneath the topmost chip layer (the "top TSV"), between a bottommost chip layer and a layer immediately above that bottommost layer (the "bottom TSV"), or between two chip layers wherein neither is the topmost chip layer or the bottommost chip layer (the "middle TSV").

A second aspect of the present disclosure may be directed to a TSV detecting method, comprising: transmitting, according to a first clock signal, an input signal to a first input unit and further to a first input of a first comparison unit, wherein the TSV detecting circuit comprises a first detecting module and a second detecting module, the first detecting module comprises the first input unit, a first switching unit, and the first comparison unit, and the first switching unit is configured to transmit a signal of a first node coupled to a first terminal of a TSV to a second input of the first comparison unit under a control of a first detection control signal; transmitting, by the TSV detecting circuit, according to a second clock signal, the input signal to a second input unit and further to a second node, wherein the second detecting module comprises the second input unit and a second switching unit, and the second switching unit is configured to transmit a signal of the second node to a second terminal of the TSV under a control of a second detection control signal; turning on the first switching unit by the first detection control signal and turning on the second switching unit by the second detection control signal, and transmitting the input signal to the second input of the first comparison unit through the second switching unit, the TSV, and the first switching unit; and comparing, by the TSV detecting circuit, signals input into the first input and the second input of the first comparison unit, and outputting a comparison result.

According to one exemplary embodiment of the present disclosure, the method may further comprise: sequentially transmitting, according to the second clock signal, the input signal to a plurality of second input units and further to corresponding second nodes; sequentially transmitting, according to the first clock signal, the input signal to a plurality of first input units and further to first inputs of a plurality of first comparison units; turning on a plurality of first switching units by a first detection control signal and turning on a plurality of second switching units by a second detection control signal, so that the input signal is respectively transmitted to second inputs of a plurality of first comparison units through the plurality of second switching units, a plurality of TSVs connected with the plurality of second switching units, and the plurality of first switching units; comparing signals input into the first input and the second input of each of the plurality of first comparison units, and outputting a comparison result.

According to one exemplary embodiment of the present disclosure, the TSV detecting method may further comprise: respectively transmitting the output signals of the plurality of first comparison units to the third comparison unit, wherein the third comparison unit compares the output signals of the plurality of first comparison units, and outputs a comparison result.

According to one exemplary embodiment of the present disclosure, the TSV detecting method may further comprise: detecting a defected TSV in a plurality of chip layers; determining a location of the defected TSV; and shielding the defected TSV with a redundant TSV disposed in the plurality of chip layers; wherein the defected TSV is located anywhere in the IC, such as between a topmost chip layer and a layer immediately beneath the topmost chip layer (the "top TSV"), between a bottommost chip layer and a layer immediately above that bottommost layer (the "bottom TSV"), or between two chip layers wherein neither is the topmost chip layer or the bottommost chip layer (the "middle TSV").

A third aspect of the present disclosure may be directed an integrated circuit (IC) manufacturing method, comprising the above TSV detecting method.

A fourth aspect of the present disclosure may be directed to an integrated circuit which is essentially free of defective TSVs made by the above IC manufacturing method.

The TSV detecting circuit provided by the present disclosure transmits, according to a first input unit, an input signal to a first input of a first comparison unit; transmitting, according to a second input unit, the input signal to a second node; turning on a first switching unit by a first detection control signal and turning on a second switching unit by a second detection control signal, so that the input signal at the second node is transmitted to a second input of the first comparison unit through the second switching unit, the TSV, and the first switching unit. That is, an original input signal is input into the first input of the first comparison unit, and an input signal through the TSV is input into the second input of the first comparison unit, and then the two signals are compared. If there are differences between the two signals, the TSV is faulty, otherwise, the TSV is not faulty. Since the TSV detecting circuit provided by the present disclosure has a simple structure and is convenient to manufacture, it is suitable to be used in a mass production of 3D chips, and the production cost can be reduced.

It is to be understood that both the foregoing general description and the following detailed description are exemplary and explanatory only and are not restrictive of this disclosure.

BRIEF DESCRIPTION OF THE DRAWINGS

The features and advantages of the present disclosure will be more obvious from the detailed description of the embodiments with reference to accompany drawings.

Figure 1A:
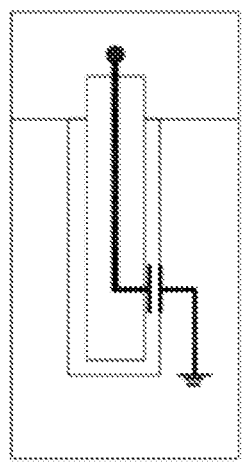
FIG. 1a is a schematic diagram of a TSV without a fault.

In these figures:
100, a first detection module;
110, a first input unit;
111, a first flip-flop;
112, a first selector;
120, a first switching unit;
130, a first comparison unit;
200, a second detection module;
210, a second input unit;
211, a second flip-flop;
212, a second selector;
220, a second switching unit;
230, a second comparison unit;
300, a third comparison unit.

DETAILED DESCRIPTION

Exemplary embodiments will now be described more fully with reference to the accompanying drawings. However, these exemplary embodiments can be implemented in many forms and should not construe limitations to those set forth. Rather, these embodiments are presented to provide a full and thorough understanding of the present invention and to fully convey the concepts of the exemplary embodiments to others skilled in the art. Throughout the figures, like reference numerals indicate identical or similar elements, so any duplicate description of them will be omitted.

In addition, the described features, structures, and characteristics may be combined in any suitable manner in one or more embodiments. In the following detailed description, many specific details are set forth to provide a more thorough understanding of the present disclosure. However, those skilled in the art will recognize that the various embodiments can be practiced without one or more of the specific details, or with other methods, components, materials, or the like. In some instances, well-known structures, materials, or operations are not shown or not described in detail to avoid obscuring aspects of the embodiments.

The represented blocks in the figures are functional entities, which may not necessarily correspond to physically separated entities. In other words, these functional entities may be implemented as software, or entirely or partially in one or more software-hardware modules, or in different networks and/or processor devices and/or microcontroller devices.

Figure 1B:
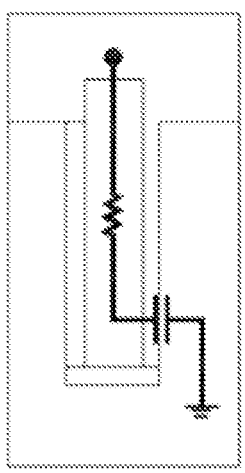
FIG. 1b is a schematic diagram of a TSV with a resistive open fault.
Figure 1C:
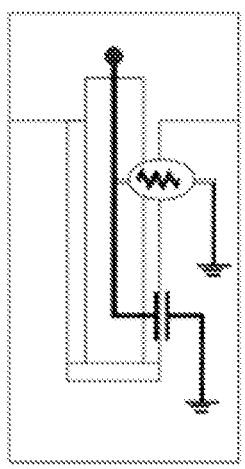
FIG. 1c is a schematic diagram of a TSV with a leakage fault.

In the related art, a non-fault TSV is shown in FIG. 1A. However, the TSV may have a resistive open fault as shown in FIG. 1B, or a leakage fault as shown in FIG. 1C. The signal passing through the TSV may change when there is a resistive open fault or leakage fault in the TSV.

In embodiments of the present invention, a through silicon via (TSV) detecting circuit, a detecting method, an integrated circuit (IC), and an integrated circuit (IC) manufacturing method having the same are disclosed. The IC manufacturing method can detect a defected TSV in a plurality of chip layers/tiers during any stage of the manufacture process, and the location of the defected TSV can be determined. In some embodiments of the present disclosure, the detected TSV can be shielded with a redundant TSV disposed in the plurality of chip layers, wherein the defected TSV may be located anywhere in the IC, such as between the topmost chip layer and the layer immediately beneath the topmost chip layer (the "top TSV"), between the bottommost chip layer and the layer immediately above the bottommost layer (the "bottom TSV"), or between two chip layers wherein neither is the topmost or bottommost chip layer (the "middle TSV"), or.

Figure 2:
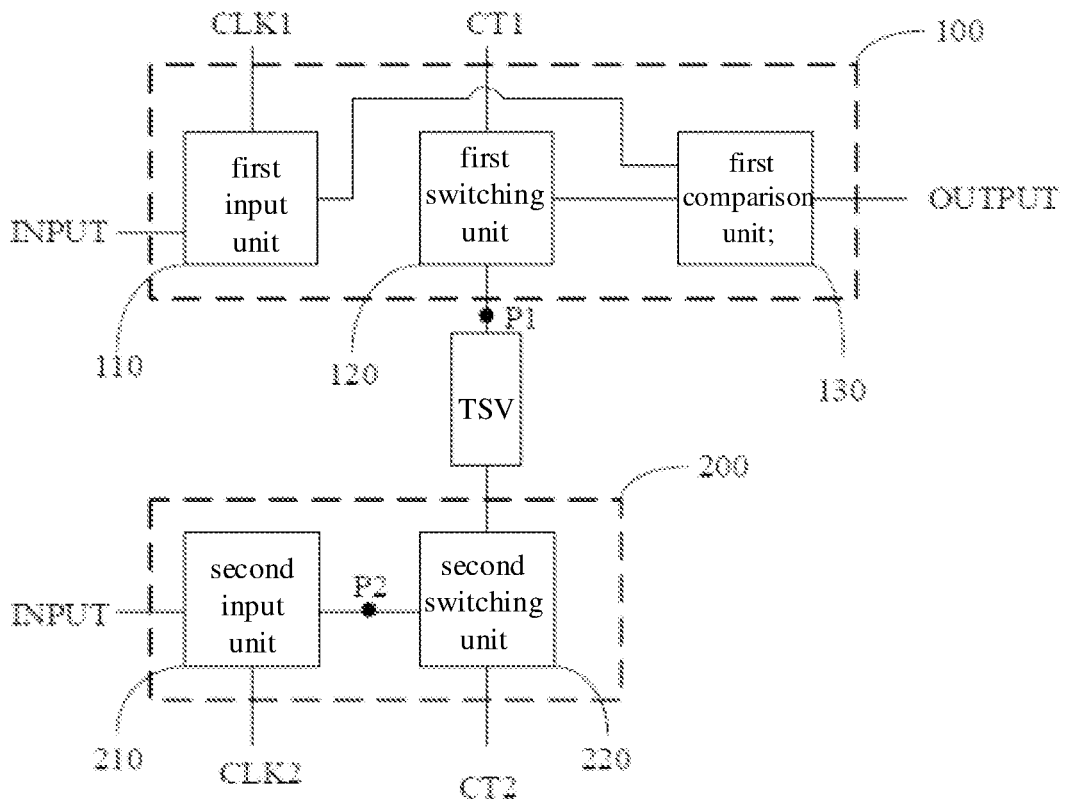
FIG. 2 is a schematic diagram of a TSV detecting circuit according to an embodiment of the present disclosure.

In one embodiment of the present disclosure, a through silicon via (TSV) detecting circuit is provided. As shown in FIG. 2, the TSV detecting circuit may include a first detecting module 100 and a second detecting module 200.

The first detecting module 100 may include a first input unit 110, a first switching unit 120, and a first comparison unit 130.

A first input unit 110 is configured to transmit an input signal to a first input of the first comparison unit 130 controlled by a first clock signal CLK1.

A first switching unit 120 is configured to transmit a signal of a first node P1 to a second input of the first comparison unit 130 controlled by a first detection control signal CT1, and the first node P1 is coupled to a first terminal of the TSV.

The second detecting module 200 may include a second input unit 210 and a second switching unit 220.

A second input unit 210 is configured to transmit the input signal to a second node P2 controlled by a second clock signal CLK2.

A second switching unit 220 is configured to transmit the signal of the second node P2 to a second terminal of the TSV controlled by a second detection control signal CT2.

The first comparison unit 130 receives the signal output by the first input unit 110, and the signal output by the first switching unit 120, which passes through the second input unit 210, the second switching unit 220, and the TSV. The first comparison unit 130 may be configured to compare the two signals received at the two inputs thereof. If the signals of the two inputs of the first comparison unit 130 are different, the TSV is faulty, otherwise, the TSV is not faulty.

It should be noted that, the difference between the signals of the two inputs of the first comparison unit 130 in the embodiment of the present disclosure may be a value within a range. That is, if the difference of the input signals at the first input and the second input of the first comparison unit 130 is within a predetermined range, the input signals at the two inputs of the first comparison unit 130 can be considered as no difference.

The TSV detecting circuit provided by the present disclosure may transmit, an input signal to a first input of a first comparison unit 130 via a first input unit 110, and turn on a first switching unit 120 by a first detection control signal CT1. The TSV detecting circuit may transmit the input signal to a second node P2 via a second input unit 210, and turn on a second switching unit 220 by a second detection control signal CT2 to transmit the signal at the second node P2 to the second input of the first comparison unit 130 through the second switching unit 220, the TSV, and the first switching unit 120. That is, an original input signal is input to the first input of the first comparison unit 130, the input signal passing through the TSV is input to the second input of the first comparison unit 130, and then the first comparison unit 130 compares the two signals. If there is a difference between the two signals, the TSV is faulty, otherwise, the TSV is not faulty. Since the TSV detecting circuit provided by the present disclosure has a simple structure and is convenient to manufacture, it is suitable to be used in a mass production of 3D chips, and the production cost can be reduced.

Each of the modules and units in the TSV detecting circuit provided by the embodiments of the present disclosure will be described in greater details below.

Figure 3:
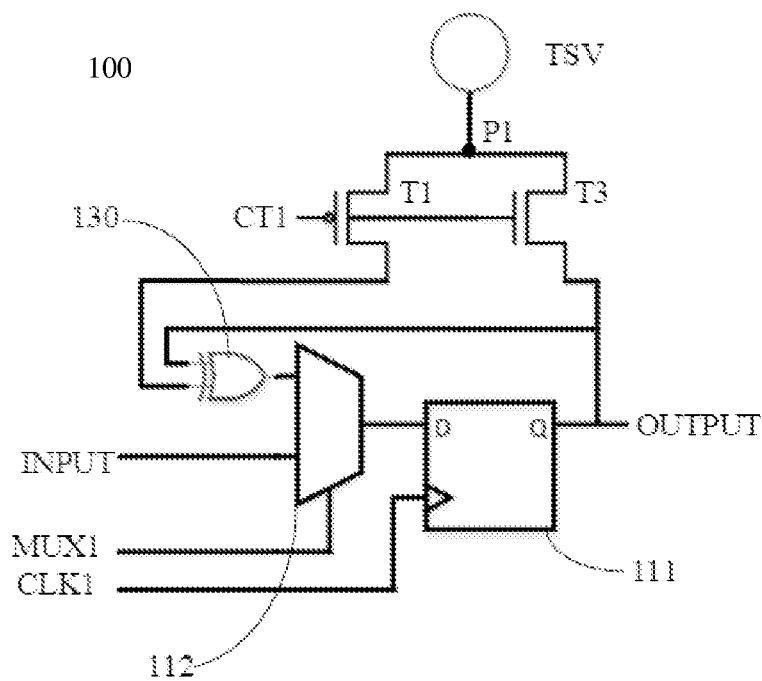
FIG. 3 is a schematic diagram of a first detecting module according to an embodiment of the present disclosure.

As shown in FIG. 3, the first input unit 110 may include a first flip-flop 111 comprising an input coupled to the input signal directly or indirectly, an output coupled to the first input of the first comparison unit 130, and a clock terminal coupled to the first clock signal CLK1. The first flip-flop 111 outputs, controlled by the first clock signal CLK1, the input signal to the first terminal of the first comparison unit 130.

Figure 4:
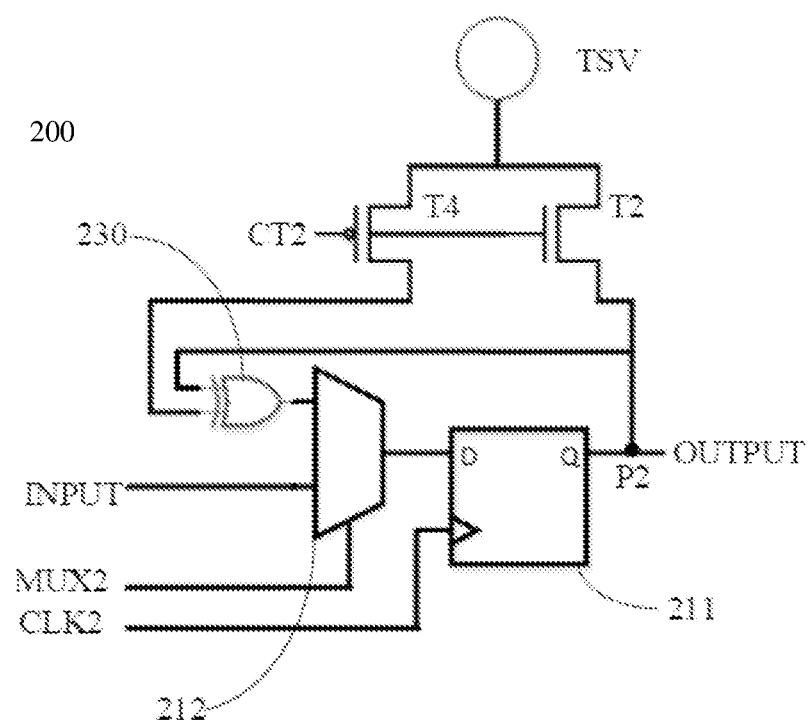
FIG. 4 is a schematic diagram of a second detection module according to an embodiment of the present disclosure.

As shown in FIG. 4, the second input unit 210 may include a second flip-flop 211 comprising an input coupled to the input signal directly or indirectly, an output coupled to the second node P2, and a clock terminal coupled to the second clock signal CLK2.

During detection, the second flip-flop 211 transmits, controlled by the second clock signal CLK2, the input signal to the second node P2. The first switching unit 120 is turned on in response to the first detection control signal CT1, the second switching unit 220 is turned on in response to the second detection control signal CT2, and the signal of the second node P2 is transmitted to the second input of the first comparison unit 130 through the second switching unit 220, the TSV, and the first switching unit 120. The first flip-flop 111 transmits the input signal to the first input of the first comparison unit in response to the first clock signal CLK1, and whether the TSV is faulty may be determined by comparing the signals of the two inputs of the first comparing unit 130.

The first detection control signal CT1 and the second detection control signal CT2 may be the same or different, and the first clock signal CLK1 and the second clock signal CLK2 may be the same or different, which are not specifically limited in the embodiments of the present disclosure.

The first input unit 110 may further include a first selector 112 comprising a first input coupled to the input signal, a second input coupled to the output of the first comparison unit 130, a control terminal coupled to a first selection control signal MUX1, and an output coupled to the input of the first flip-flop 111. The first selector 112 may enable, in response to the first selection control signal MUX1, the connection between the first input to the output to transmit the input signal to the input of the first flip-flop 111, or the connection between the second input to the output to transmit the signal output by the first comparison unit 130 to the input of first flip flop 111.

The first detecting module 100 may further include: a third switching unit comprising a first/input terminal coupled to the output of the first flip-flop 111, a second/output terminal coupled to the first node P1, and a control terminal coupled to the first detection control signal CT1. The third switching unit is turned on in response to the first detection control signal CT1, so that the signal at the output of the first flip-flop 111 is transmitted to the first node P1.

The second input unit 210 may further include a second selector 212 comprising a first input coupled to the input signal, a control terminal coupled to a second selection control signal MUX2, and an output coupled to the input of the second flip-flop 211.

The second selector 212 may enable, in response to the second selection control signal MUX2, the connection between the first input to the output thereof to transmit the input signal to the input of the second flip-flop 211, or the connection between the second input to the output thereof to transmit the signal output by the second comparison unit 230 to the input of second flip-flop 211.

The second detecting module 200 further includes: a fourth switching unit comprising a first/input terminal coupled to the second terminal of the TSV and a control terminal coupled to the second detection control signal CT2. The fourth switching unit is turned on in response to the second detection control signal CT2, so that a signal of the second terminal of the TSV is transmitted to the first input of the second comparison unit 230.

The second detecting module 200 may further include the second comparison unit 230, comprising a first input coupled to a second terminal of the fourth switching unit, a second input coupled to the second node P2 and an output coupled to a second input of the second selector 212.

In order to test the TSV connecting different chip layers/tiers, the first detecting module 100 may be disposed in a first chip layer, the second detecting module 200 may be disposed in a second chip layer, and the first chip layer and the second chip layer are connected by the TSV.

It should be noted that the first chip layer and the second chip layer described in the embodiments of the present disclosure may be chip layers adjacent to each other, or may be non-adjacent chip layers. When the first chip layer and the second chip layer are adjacent chip layers, the first detecting module 100 and the second detecting module 200 are configured to test the TSV connecting adjacent chip layers. When the first chip layer and the second chip layer are non-adjacent chip layers, the first chip layer, the second chip layer, and a plurality of chip layers therebetween can be connected by multiple sequentially connected TSVs, and the first detecting module 100 and the second detecting module 200 may be configured to test the multiple sequentially connected TSVs.

To facilitate the detection, the first detecting module 100 and the second detecting module 200 may have the same structure, which is referred as a detecting module, and the detecting module may be disposed on each of the chip layers. The detecting module may include components of an input unit, two switching units, and a comparison unit. When performing a detection, components can be selected and combined according to the detection requirement to detect any one of the TSVs or any number of sequentially connected TSVs.

Figure 5:
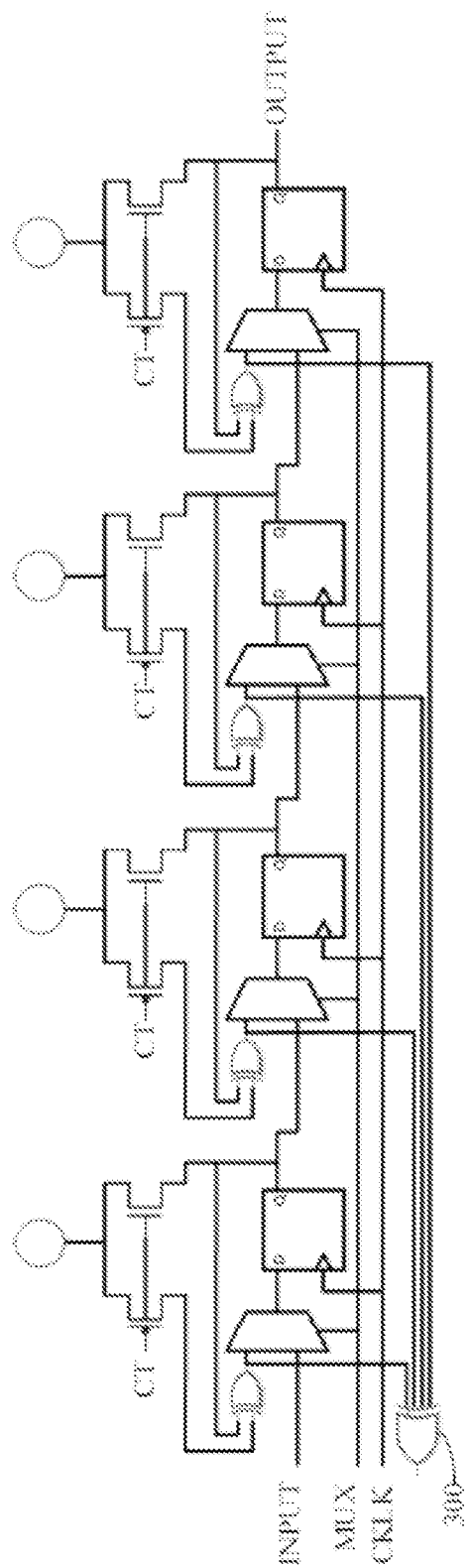
FIG. 5 is a schematic diagram of connection of a plurality of detection modules according to an embodiment of the present disclosure.

As shown in FIG. 5, a plurality of first detecting modules 100 are sequentially disposed on the first chip layer, wherein the output of the first flip-flop of each first detecting module 100 is connected to the input of an immediately succeeding first detecting module 100. Similarly, a plurality of second detecting modules 200 may be sequentially disposed on the second chip layer, wherein the output of the second flip-flop of each second detecting module 200 is connected to the input of an immediately succeeding second detecting module 200.

In a practical application, a plurality of TSVs are usually disposed in one chip layer. Therefore, a plurality of first detecting modules 100 may be disposed on the first chip layer, and a plurality of second detecting modules 200 may be disposed on the second chip layer. Generally, the number of first detecting modules 100 corresponds to the number of second detecting modules 200 and the number of TSVs.

Figure 6:
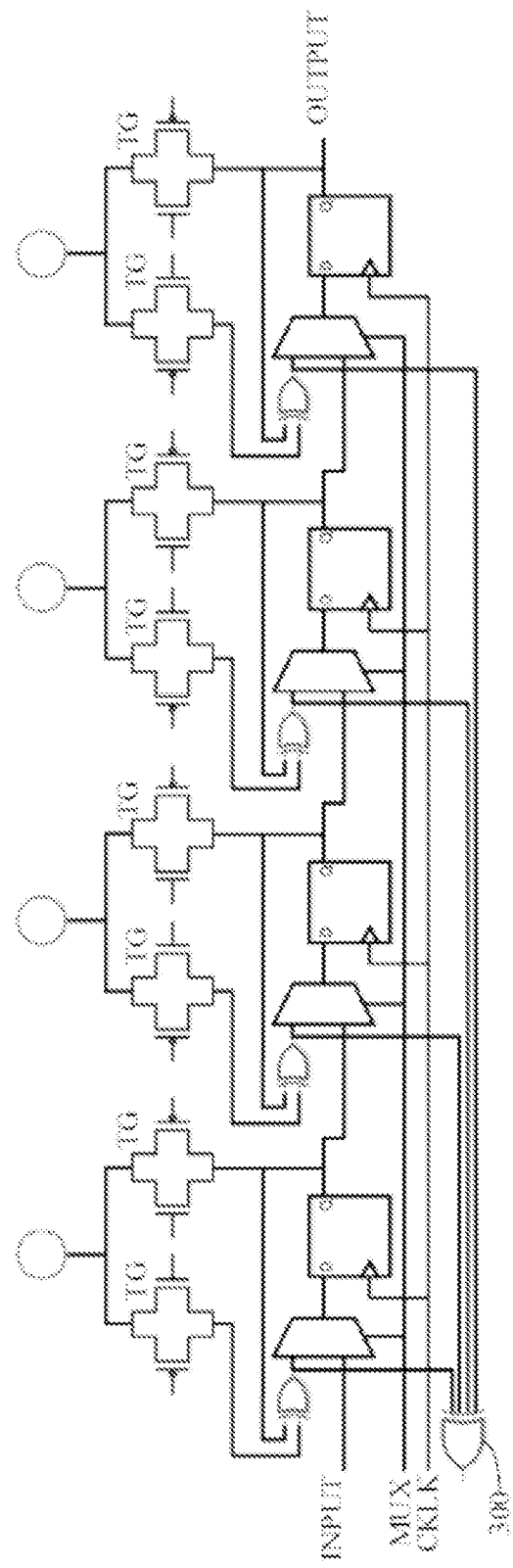
FIG. 6 is a schematic diagram of connection of a plurality of detection modules according to another embodiment of the present disclosure.
Figure 7:
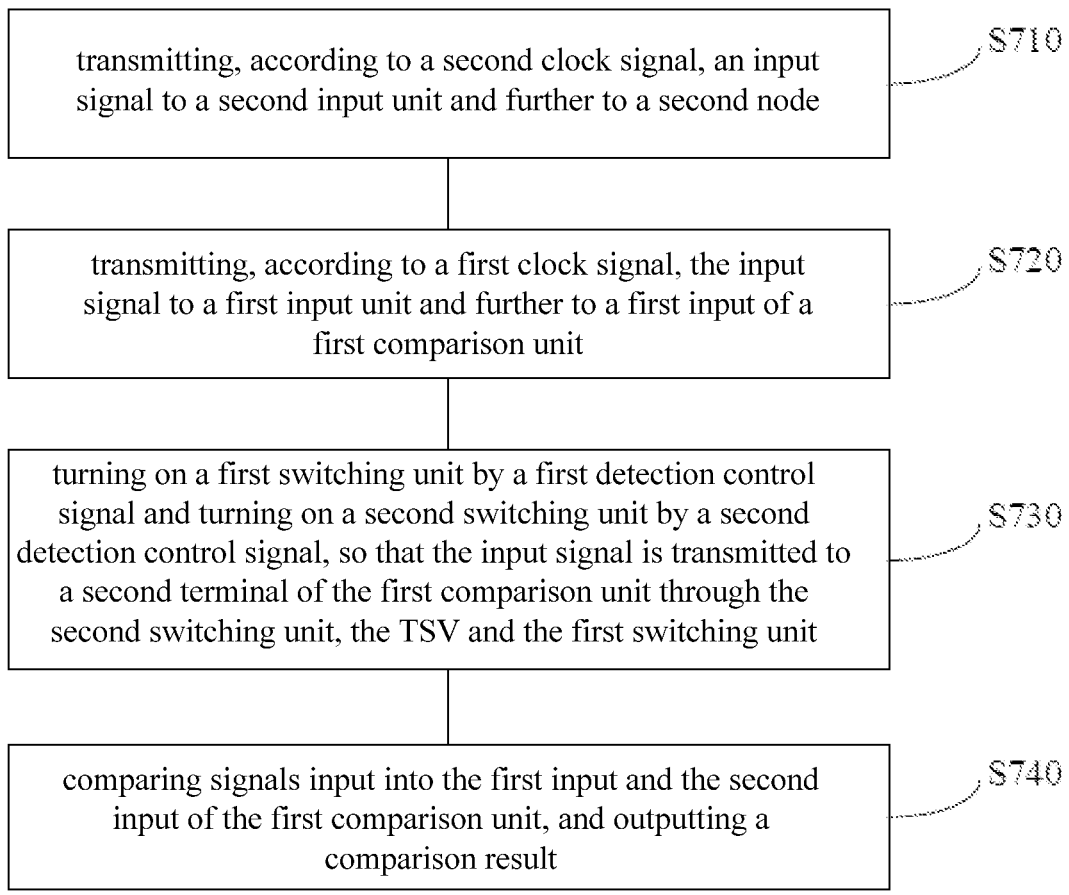
FIG. 7 is a flowchart of a TSV detecting method according to an embodiment of the present disclosure.
Figure 8:
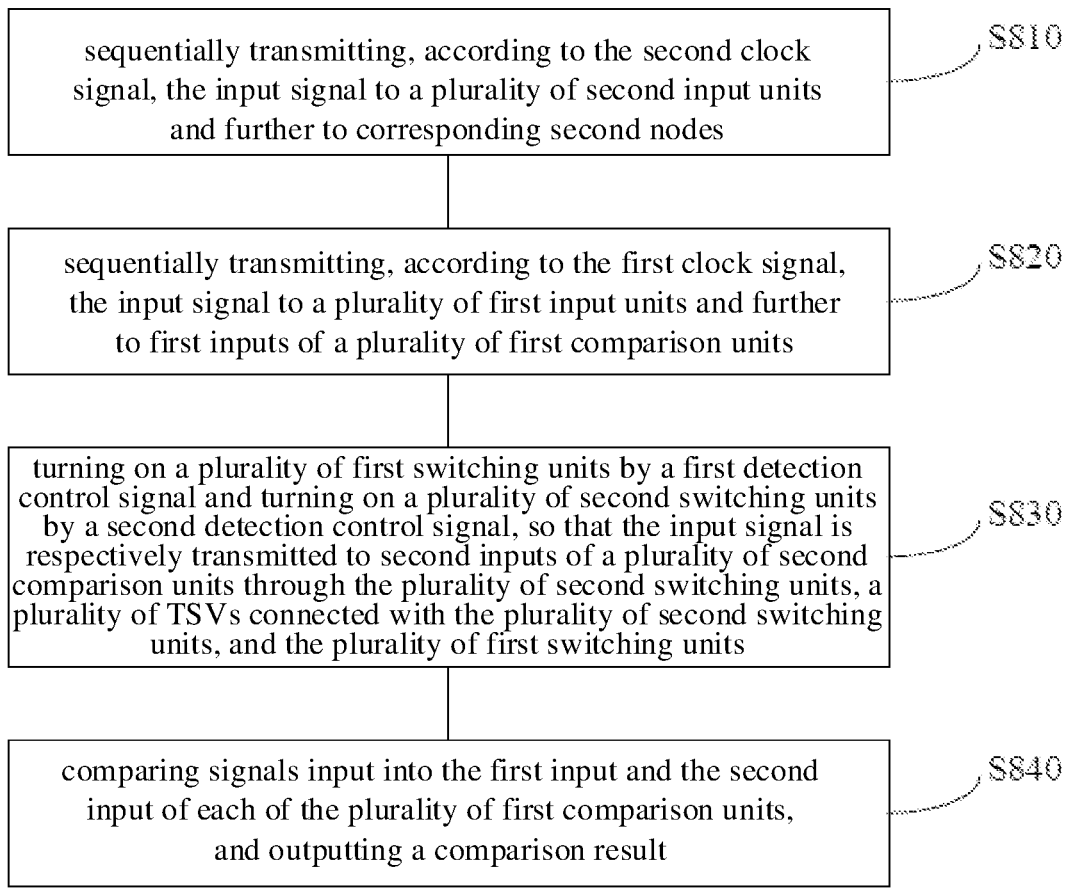
FIG. 8 is a flowchart of a TSV detecting method according to another embodiment of the present disclosure.

To facilitate the fabrication and control, the first detecting module 100 and the second detecting module 200 may have the same structures, which are referred to as a detecting module. A plurality of detecting modules may be sequentially disposed in one chip layer, and the output of the input unit of each detecting module is connected to the input of an immediately succeeding detecting module. A plurality of detecting modules is respectively disposed in each chip layer, and the plurality of detecting modules are respectively connected to the corresponding TSVs. Each of the chip layers is provided with a third comparison unit 300, and the outputs of the plurality of first comparison units of the plurality of first detecting modules are respectively connected to inputs of the third comparison unit 300. That is, the same circuit as shown in FIG. 5 or FIG. 6 is disposed in each of the chip layers, and all or a part of the circuits are tested according to practical needs during the detection.

During the detection, the input signal is sequentially input into the plurality of second input units 210 disposed on the second chip layer under a control of the second clock signal CLK2. Then the plurality of second switching units 220 are turned on according to the second detection control signal CT2, and the plurality of first switching units 120 are turned on according to the first detection control signal CT1, so that the input signal is respectively transmitted to second inputs of a plurality of first comparison units 130 through the plurality of second switching units 220, a plurality of TSVs, and the plurality of first switching units 120. The input signal is also sequentially transmitted, under the control of the first clock signal CLK1, to the plurality of first input units 110 and further to first inputs of a plurality of first comparison units 130.

A plurality of first flip-flops 111 may be sequentially connected to form a scan chain. After the plurality of first comparison units outputs the comparison results, the comparison results are input into the corresponding first flip-flops through the first selection control signal MUX1. The first clock signal CLK1 controls the plurality of first flip-flops to sequentially pass the comparison results to the next first flip-flops, and the comparison results are sequentially output through the last flip-flop of the scan chain. Whether the multiple TSVs are faulty may be determined by the comparison results and the order of the comparison results.

Further, in order to quickly determine whether there is a faulty TSV in the plurality of TSVs, the TSV detecting circuit may further include a third comparing unit 300, wherein outputs of the plurality of the first comparing units 130 are respectively connected to the inputs of the third comparison unit 300. If the results output by the plurality of first comparison units 130 and compared by the third comparison unit 300 show a discrepancy, then there is at least a faulty TSV among the plurality of TSVs.

The comparison units described in the embodiments of the present disclosure may include XOR gates. For example, the first comparison unit 130 and the second comparison unit 230 may be a two-input XOR gate. If the two-input XOR gate of the first comparison unit 130 outputs a "1", then the corresponding TSV has a fault. If the two-input XOR gate of the first comparison unit 130 outputs a "0", then the corresponding TSV has no fault. The third comparison unit 300 may include a multi-input comparison unit whose number of inputs is determined by the number of TSVs. If the multi-input comparison unit outputs 1, then at least one faulty TSV exists among the plurality of TSVs. If it outputs a "0", one case is that the plurality of TSVs have no fault, and the other case is that each of the multiple TSVs has a fault. This can be determined by the data output by the scan chain. When the scan chain outputs a "0", each of the multiple TSVs has no fault, and vice versa, each of the multiple TSVs has a fault. However, in real applications, the probability of each of the multiple TSVs being faulty is extremely small. The third comparison unit 300 may comprise other components, such as OR gates or NAND gates.

In one embodiment of the present disclosure, the first switching unit 120 includes a first transistor T1 which may be an NMOS (N-type metal oxide semiconductor transistor), and the second switching unit 220 includes a second transistor T2 which may be a PMOS (P-type metal-oxide-semiconductor transistor). When the TSV detecting circuit further includes a third switching unit and a fourth switching unit, the third switching unit may include a third transistor T3 which may be an PMOS, and the fourth switching unit may include a fourth transistor T4 which may be a NMOS. The first switching unit 120 and the third switching unit may be controlled to be turned on at different times according to the first detection control signal CT1. The second switching unit 220 and the fourth switching unit may be controlled to be turned on at different times according to the second detection control signal CT2.

Alternatively, the first transistor T1 may be a PMOS, the second transistor T2 may be an NMOS, the third transistor T3 may be a NMOS, and the fourth transistor T4 may be an PMOS. At this time, the first transistor T1 and the third transistor T3 may be controlled to be turned on at different times according to the first detection control signal CT1. The second transistor T2 and the fourth transistor T4 may be controlled to be turned on at different times according to the second detection control signal CT2.

The control terminal of each of the transistors may be the gate of the transistor. The first terminal may be the source of the transistor and the second terminal may be the drain of the transistor, or the first terminal may be the drain of the transistor and the second terminal may be the source of the transistor, which is not specifically limited in the embodiment of the present disclosure.

In one embodiment of the present disclosure, as shown in FIG. 6, each of the first switching unit 120 and the second switching unit 220 is a CMOS transmission gate TG. When the TSV detecting circuit further includes the third switching unit and the fourth switching unit, the third switching unit and the fourth switching unit may also be the CMOS transmission gate TG.

According to the TSV detecting circuit provided by the embodiments of the present disclosure, the first detecting module 100 and the second detecting module 200 may have the same structure in applications. In the plurality of chip layers, the number of detecting modules is determined according to the number of TSVs. Since the detecting modules have the same structure, they are easy to manufacture, are suitable to be used in large-scale integrated circuits, and can detect one or more TSVs by enabling the detecting modules of different layers according to the detection control signals.

In practical applications, spare TSVs can be set in each of the chip layers. If the TSV detecting circuit detects a faulty TSV, a spare TSV can be enabled to replace the faulty TSV.

An embodiment of the present disclosure may further provide a TSV detecting method using the above-described TSV detecting circuit comprising the following steps.

In step S710, an input signal is transmitted, according to a second clock signal CLK2, to a second input unit 210 and further to a second node P2.

In step S720, the input signal is transmitted, according to a first clock signal CLK1, to a first input unit 110 and further to a first input of a first comparison unit 130.

In step S730, a first switching unit 120 is turned on by a first detection control signal CT1, and a second switching unit 220 is turned on by a second detection control signal CT2, so that the input signal is transmitted to a second terminal of the first comparison unit 130 through the second switching unit 220, the TSV, and the first switching unit 120.

In step S740, signals input into the first input and the second input of the first comparison unit 130 are compared, and a comparison result is output.

Further, a plurality of first detecting modules 100 may be sequentially disposed in the first chip layer, wherein an output of each first detecting module 100 is connected to an input of an immediately succeeding first detecting module 100. A plurality of second detecting modules 200 may be sequentially disposed in the second chip layer, wherein the output of each second detecting module 200 is connected to the input of an immediately succeeding second detecting module 200.

The TSV detecting method may further include the following steps.

In step S810, the input signal may be sequentially transmitted, according to the second clock signal CLK2, to a plurality of second input units 210 and further to corresponding second nodes P2.

In step S820, the input signal may be sequentially transmitted, according to the first clock signal CLK1, to a plurality of first input units 110 and further to first inputs of a plurality of corresponding first comparison units 130.

In step S830, a plurality of first switching units 120 may be turned on by a first detection control signal CT1, and a plurality of second switching units 220 may be turned on by a second detection control signal CT2, so that the input signal is respectively transmitted to second inputs of a plurality of first comparison units 130 through the plurality of second switching units 220, a plurality of TSVs, and the plurality of first switching units 120.

In step S840, signals input into the first input and the second input of each of the plurality of first comparison units 130 may be compared, and a comparison result may be output.

Further, when the TSV detecting circuit further includes a third comparison unit 300, the TSV detecting method may further include step S850. In step S850, the output signals of the plurality of first comparison units 130 is respectively transmitted to the third comparison unit 300, the output signals of the first comparison units 130 are compared by the third comparison units 300, and a comparison result is output.

Details of the TSV detecting method have been described in the above-described TSV detecting circuit and will not be repeated herein.

The one embodiment of the present disclosure further provides an integrated circuit, particularly a 3D integrated circuit including the above-described TSV detecting circuit. Of course, the integrated circuit may also include components such as a PCB, a capacitor, or a resistor, which are not be described herein.

It should be noted that, although the various steps of the method of the present disclosure are described in a particular order in the drawings, this does not require or imply that the steps must be performed in the specific order, or that all the steps shown must be performed in order to achieve the desired results. Certain steps may be omitted, multiple steps may be combined into one step for execution, and/or one step may be decomposed into multiple steps for executions and the like.

As be appreciated by one skilled in the art, aspects of the present invention may be embodied as a system, a method, or a program product. Accordingly, aspects of the present invention may be in a form of an entire hardware embodiment, an entire software embodiment (including firmware, micro-code, etc.), or an embodiment combining software and hardware aspects, which may generally be referred to as a "circuit," "module," or "system".

Further, the incorporated figures are merely illustrations of a series of processes included in the method according to embodiments of the present invention and do not construe the limitations thereof. It will be appreciated that the way in which the processes are illustrated does not indicate any chronological order of them or limit them to a chronological order. Furthermore, it will also be appreciated that the processes may be performed, for example, synchronously or asynchronously in multiple modules.

Other embodiments of the present disclosure will be apparent to those skilled in the art from considering the specification and practicing the invention disclosed herein. Accordingly, this disclosure covers all and any variations, uses, or adaptations of the present disclosure, which follow the general principles of the present disclosure and include any undisclosed common knowledge or customary practice within the art to which the present disclosure pertains. The specification and examples are merely exemplary, the true scope and spirit of the present disclosure are indicated by the appended claims.

It is to be understood that the present disclosure is not limited to the exact structures as described above and illustrated in the figures and may be modified or changed without departing from the scope of the present disclosure. The scope of the present disclosure is defined by the appended claims.

What is claimed is:

1. A through-silicon via (TSV) detecting circuit configured to be coupled to a TSV, the TSV detecting circuit comprising:
    a first detecting module coupled to a first terminal of the TSV, the first detecting module including:
        a first comparison unit;
        a first input unit, configured to receive and transmit an input signal to a first input of the first comparison unit under a control of a first clock signal, wherein the first input unit comprises: a first flip-flop, comprising an input coupled to the input signal, an output coupled to the first input of the first comparison unit, and a clock terminal coupled to the first clock signal; and
        a first switching unit, configured to transmit a signal of a first node to a second input of the first comparison unit under a control of a first detection control signal, the first node being coupled to the first terminal of the TSV; and
    a second detecting module coupled to a second terminal of the TSV, the second detecting module including:
        a second input unit, configured to receive and transmit the input signal to a second node under a control of a second clock signal; and
        a second switching unit, configured to transmit a signal of the second node to the second terminal of the TSV under a control of a second detection control signal.

2. The TSV detecting circuit of claim 1, wherein the first input unit further comprises:
    a first selector, comprising a first input coupled to the input signal, a second input coupled to an output of the first comparison unit, a control terminal coupled to a first selection control signal, and an output coupled to the input of the first flip-flop.

3. The TSV detecting circuit of claim 2, wherein the first detecting module further comprises:

a third switching unit, comprising a first terminal coupled to the output of the first flip-flop, a second terminal coupled to the first node, and a control terminal coupled to the first detection control signal.

4. A through-silicon via (TSV) detecting circuit configured to be coupled to a TSV, the TSV detecting circuit comprising:
a first detecting module coupled to a first terminal of the TSV, the first detecting module including:
a first comparison unit;
a first input unit, configured to receive and transmit an input signal to a first input of the first comparison unit under a control of a first clock signal; and
a first switching unit, configured to transmit a signal of a first node to a second input of the first comparison unit under a control of a first detection control signal, the first node being coupled to the first terminal of the TSV; and
a second detecting module coupled to a second terminal of the TSV, the second detecting module including:
a second input unit, configured to receive and transmit the input signal to a second node under a control of a second clock signal, wherein the second input unit comprises: a second flip-flop, comprising an input coupled to the input signal, an output coupled to the second node, and a clock terminal coupled to the second clock signal; and
a second switching unit, configured to transmit a signal of the second node to the second terminal of the TSV under a control of a second detection control signal.

5. The TSV detecting circuit of claim 4, wherein the second input unit further comprises:
a second selector, comprising a first input coupled to the input signal, a control terminal coupled to a second selection control signal, and an output coupled to the input of the second flip-flop.

6. The TSV detecting circuit of claim 5, wherein the second detecting module further comprises:
a fourth switching unit, comprising a first terminal coupled to the second terminal of the TSV and a control terminal coupled to the second detection control signal; and
a second comparison unit, comprising a first input coupled to a second terminal of the fourth switching unit, a second input coupled to the second node, and an output coupled to a second input of the second selector.

7. The TSV detecting circuit of claim 6, wherein:
the first detecting module is disposed on a first chip layer;
the second detecting module is disposed on a second chip layer; and
the first chip layer and the second chip layer are connected by at least one TSV.

8. The TSV detecting circuit of claim 7, wherein the at least one TSV includes a plurality of sequentially connected TSVs.

9. The TSV detecting circuit of claim 7, wherein:
a plurality of first detecting modules is sequentially disposed on the first chip layer, and the output of the first flip-flop of each first detecting module is connected to the input of an immediately succeeding first detection module; and
a plurality of second detecting modules are sequentially disposed on the second chip layer, and the output of the second flip-flop of each second detecting module is connected to the input of an immediately succeeding second detection module.

10. The TSV detecting circuit of claim 9, further comprising:
a third comparison unit, wherein the outputs of a plurality of first comparison units of the plurality of first detecting modules are respectively connected to inputs of the third comparison unit.

11. The TSV detecting circuit of claim 10, wherein each of the comparison units includes at least an XOR gate.

12. The TSV detecting circuit of claim 1, wherein:
the first switching unit is an N-type MOS transistor and the second switching unit is a P-type MOS transistor; or
the first switching unit is a P-type MOS transistor and the second switching unit is an N-type MOS transistor.

13. The TSV detecting circuit of claim 1, wherein each of the first switching unit and the second switching unit is a complementary metal oxide semiconductor (CMOS) transmission gate.

14. The TSV detecting circuit of claim 1, wherein the TSV detecting circuit is configured to:
detect a defected TSV in a plurality of chip layers;
determine a location of the defected TSV; and
shield the defected TSV with a redundant TSV disposed in the plurality of chip layers.

15. The TSV detecting circuit of claim 14, wherein:
the defected TSV is located between a topmost chip layer of the chip layers and a chip layer immediately beneath the topmost chip layer, or between a bottommost chip layer of the chip layers and a chip layer immediately above the bottommost layer, or between two chip layers between the topmost chip layer and the bottommost chip layer.

16. A through-silicon via (TSV) detecting method, comprising:
transmitting, according to a first clock signal, an input signal to a first input unit and further to a first input of a first comparison unit of a TSV detecting circuit, wherein the TSV detecting circuit comprises a first detecting module and a second detecting module, the first detecting module comprises the first input unit, a first switching unit, and the first comparison unit, and the first switching unit is configured to transmit a signal of a first node coupled to a first terminal of a TSV to a second input of the first comparison unit under a control of a first detection control signal;
transmitting, by the TSV detecting circuit, according to a second clock signal, the input signal to a second input unit and further to a second node, wherein the second detecting module comprises the second input unit and a second switching unit, and the second switching unit is configured to transmit a signal of the second node to a second terminal of the TSV under a control of a second detection control signal;
turning on the first switching unit by the first detection control signal and turning on the second switching unit by the second detection control signal, and transmitting the input signal to the second input of the first comparison unit through the second switching unit, the TSV, and the first switching unit;
comparing, by the TSV detecting circuit, signals input into the first input and the second input of the first comparison unit, and outputting a comparison result; and
detecting a defected TSV in a plurality of chip layers;
determining a location of the defected TSV; and
shielding the defected TSV with a redundant TSV disposed in the plurality of chip layers.

17. The TSV detecting method of claim 16, further comprising:

sequentially transmitting, according to the second clock signal, the input signal to a plurality of second input units and further to a plurality of corresponding second nodes;

sequentially transmitting, according to the first clock signal, the input signal to a plurality of first input units and further to first inputs of a plurality of first comparison units;

turning on a plurality of first switching units by the first detection control signal and turning on a plurality of second switching units by the second detection control signal, wherein the input signal is respectively transmitted to second inputs of a plurality of first comparison units through the plurality of second switching units, a plurality of TSVs coupled with the plurality of second switching units and the plurality of first switching units;

comparing signals input into the first input and the second input of each of the plurality of first comparison units, and outputting a plurality of first comparison results.

18. The TSV detecting method of claim 17, further comprising:

respectively transmitting the output signals of the plurality of first comparison units to a third comparison unit, wherein the third comparison unit compares the output signals of the plurality of first comparison units, and outputs a comparison result.

19. The TSV detecting method of claim 16, further comprising:

wherein the defected TSV located between a topmost chip layer of the chip layers and a chip layer immediately beneath the topmost chip layer, or between a bottommost chip layer of the chip layers and a chip layer immediately above the bottommost layer, or between two chip layers wherein neither is between the topmost chip layer and the bottommost chip layer.

20. The TSV detecting circuit of claim 1, wherein the second input unit comprises: a second flip-flop, comprising an input coupled to the input signal, an output coupled to the second node, and a clock terminal coupled to the second clock signal.

* * * * *

UNITED STATES PATENT AND TRADEMARK OFFICE
CERTIFICATE OF CORRECTION

| | |
|---|---|
| PATENT NO. | : 11,614,481 B2 |
| APPLICATION NO. | : 17/238476 |
| DATED | : March 28, 2023 |
| INVENTOR(S) | : You-Hsien Lin, Yi-Jun Lu and Cheng-Jer Yang |

It is certified that error appears in the above-identified patent and that said Letters Patent is hereby corrected as shown below:

In the Claims

In Claim 19, Column 16, Line 15, "two chip layers wherein neither is between the topmost" should read -- two chip layers between the topmost --

Signed and Sealed this
Sixth Day of June, 2023

Katherine Kelly Vidal
*Director of the United States Patent and Trademark Office*